United States Patent [19]
Swanson et al.

[11] Patent Number: 5,376,791
[45] Date of Patent: * Dec. 27, 1994

[54] SECONDARY ION MASS SPECTOMETRY SYSTEM

[75] Inventors: Lynwood W. Swanson; John M. Lindquist, both of Portland; Milton C. Jaehnig; Joseph Puretz, both of Beaverton, all of Oreg.

[73] Assignee: FEI Company, Hillsboro, Oreg.

[*] Notice: The portion of the term of this patent subsequent to Feb. 23, 2010 has been disclaimed.

[21] Appl. No.: 21,481

[22] Filed: Feb. 22, 1993

Related U.S. Application Data

[63] Continuation-in-part of Ser. No. 685,844, Apr. 15, 1991, Pat. No. 5,188,705.

[51] Int. Cl.$^5$ .................. H01J 37/28; H01J 37/317
[52] U.S. Cl. .................. 250/309; 250/492.21; 250/307
[58] Field of Search .................. 250/309, 492.21, 397, 250/307

[56] References Cited

U.S. PATENT DOCUMENTS

| | | | |
|---|---|---|---|
| 4,397,711 | 8/1983 | Donnelly et al. | 156/643 |
| 4,556,794 | 12/1985 | Ward et al. | 250/309 |
| 4,609,809 | 9/1986 | Yamaguchi et al. | 219/121 FM |
| 4,800,273 | 1/1989 | Phillips | 250/288 |
| 4,851,097 | 7/1989 | Hattori et al. | 204/192.33 |
| 4,876,112 | 10/1989 | Kaito et al. | 250/492.21 |
| 4,930,439 | 6/1990 | Sato et al. | 250/492.21 |
| 4,983,830 | 1/1991 | Iwasaki | 250/309 |
| 4,994,140 | 2/1991 | Kenzo et al. | 156/643 |
| 5,148,027 | 9/1992 | Umemura | 250/309 |
| 5,188,705 | 2/1993 | Swanson et al. | 156/643 |

OTHER PUBLICATIONS

Chew et al, "Iodine In Milling of Indium-containing Compound Semiconductors", *Appl. Phys. Lett.* 44 (1), 1, Jan. 1984, pp. 142–144.

Young et al, "Gas-assisted Focused Ion Beam Etching for Microfabrication and Inspection", *Microelectronic Engineering* II (1990), pp. 409–412.

Takado et al, "Chemicaly-enhanced GaAs Maskless Etching Using A Novel Focused Ion Beam Etching System with a Cholorine Molecular and Radical Beam", *Symposia Proceedings*, 1986.

Flanders et al, "Reactive Ion Etching of Indium Compounds Using Iodine Containing Plasmas", *J. Vac. Sci. Technol.* B 8 (6) Nov./Dec. 1990, pp. 1990–1993.

Yamaguchi et al, "Characteristics of silicon removal of fine focused gallium ion beam", *J. Vac. Sci. Technol.* B 3 (1) Jan./Feb. 1985 pp. 71–74.

Ochiai et al, "Pressure and Irradiation angle dependence of maskless ion beam assisted etchings of GaAs and Si$^a$", *J. Vac. Sci. Technol.* B 3 (1) Jan/Feb. 1985 pp. 67–70.

*Primary Examiner*—Bruce C. Anderson
*Attorney, Agent, or Firm*—Dellett and Walters

[57] ABSTRACT

A focused ion beam is directed toward a sample to be analyzed while iodine vapor is directed toward the sample. The iodine vapor, which is formed by heating solid iodine to a temperature of 30° C. to 50° C., aids in sputtering of material impinged by the ion beam and in enhancing the conversion of neutral to ionic sputtered species. A quadrupole mass analyzer is positioned for receiving secondary ions sputtered from the sample whereby chemical analysis is accomplished. The iodine may be initially handled in a solid state, exhibiting a low vapor pressure, and is then heated to moderate temperatures inside a focused ion beam system without presenting a toxic hazard or requiring external plumbing.

16 Claims, 3 Drawing Sheets

SECONDARY ION MASS SPECTOMETRY SYSTEM

The present invention is a continuation-in-part of U.S. patent application Ser. No. 07/685,844 filed Apr. 15, 1991, now U.S. Pat. No. 5,188,705, and entitled "Method of Semiconductor Device Manufacture".

BACKGROUND OF THE INVENTION

The present invention relates to a secondary ion mass spectrometry system and particularly to such a system providing enhanced analysis capability.

Secondary ion mass spectrometry, commonly known as SIMS, analyzes a sample by bombarding the sample with a primary ion beam. Such primary ion beam bombardment results in the production of secondary ions characteristic of the bombarded sample, the primary bombarding ions, and gases present in the vicinity of the sample. The production of secondary ions by the aforementioned method tends to be rather low under ordinary circumstances. It is known the yield of secondary ions can be increased by exposure of the sample undergoing analysis to particular gases which are usually admitted to the vicinity of the sample by external tubing. For instance, an increase in secondary ion yield is known to occur in the presence of oxygen, or in the presence cesium vapor. The provision of plumbing for admitting the secondary ion enhancement gas, in addition to whatever other gases may be employed in an ion beam system, can result in an apparatus more complicated than desired. Moreover, it would be of advantage to be able to undertake analysis in a substantially closed system without external gaseous input.

SUMMARY OF THE INVENTION

In accordance with the present invention a focused ion beam is directed onto the surface of a sample while iodine vapor is supplied within the same chamber and directed toward the sample surface. Iodine is solid at room temperature and can be easily conveyed from place to place. Solid iodine crystals can be placed in a container or crucible within the enclosure of the focused ion beam system where solid iodine is heated to slightly above room temperature to produce a small vapor pressure which is nevertheless effective in dramatically increasing the yield of certain ions. Secondary ions are directed towards a mass analyzer.

As described and claimed in the aforementioned application Ser. No. 07/685,844, the introduction of iodine results in the enhancement of ion beam machining, also without the necessity of external introduction of gas within the sample chamber. Machining can also be employed in connection with a given sample prior to mass analysis in order to expose a layer of a sample which is of interest.

The dramatic increase in sputtered ions from a sample that takes place according to the present invention is not completely understood. Thus, the increased secondary ion yield may result from an increase of the overall sputtering rate and an enhanced conversion of neutral to ionic sputtered species.

It is an object of the present invention to increase the secondary ion yield of sampled materials bombarded by an ion beam.

It is another object of the present invention to provide an improved secondary ion mass spectrometry system employing increased secondary ion yield.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

DETAILED DESCRIPTION

Figure 1:
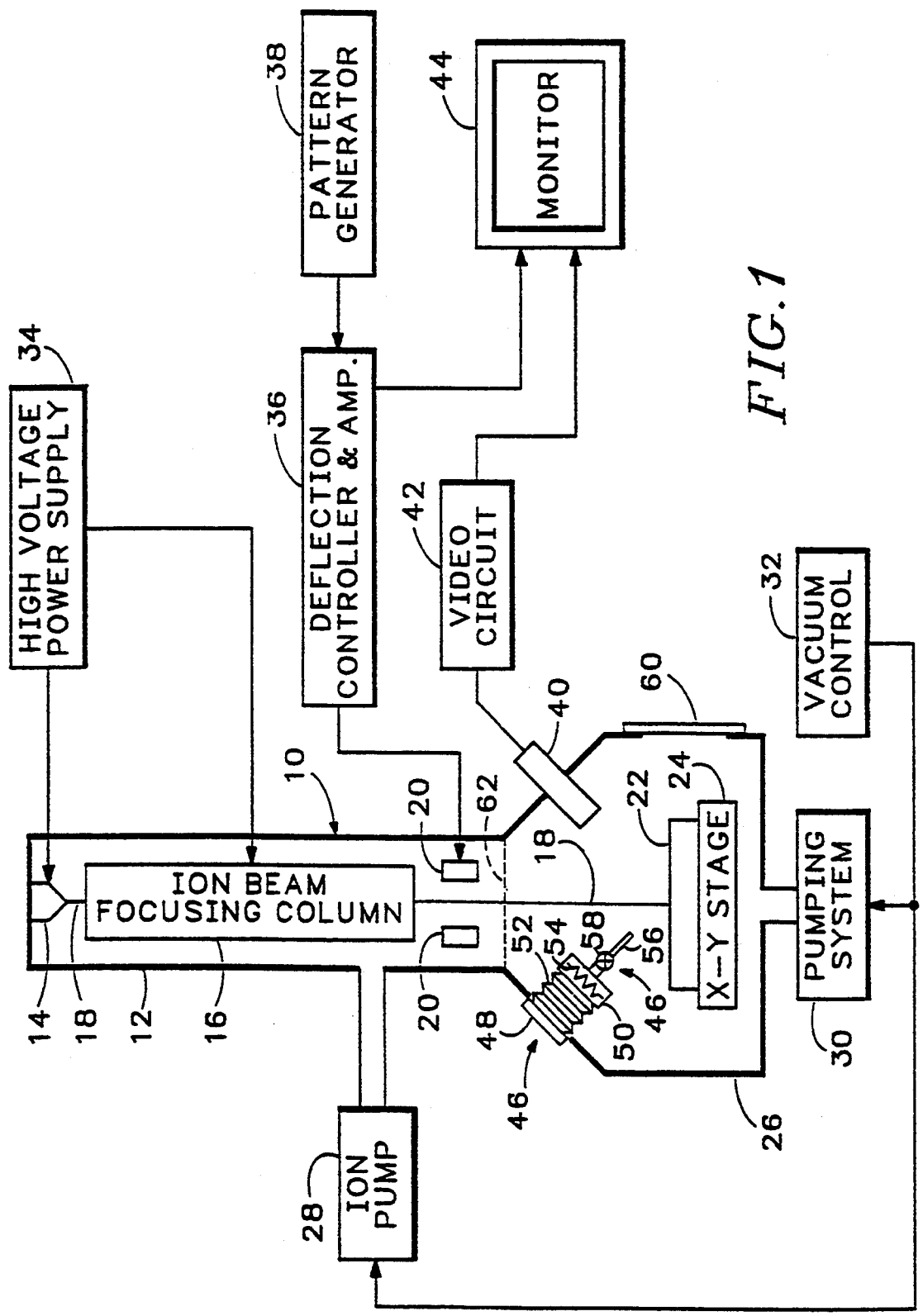
FIG. 1 is a schematic representation of a focused ion beam system adapted for carrying out the process of the present invention.

Referring to FIG. 1, illustrating a focused ion beam system for carrying out the present invention, an evacuated envelope 10 includes an upper neck portion 12 within which are located a liquid metal ion source 14 and a focusing column 16 which includes extractor electrode means and an electrostatic optical system. Ion beam 18 passes from source 14 through column 16 and through electrostatic deflection means schematically indicated at 20 toward a sample 22 suitably positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32.

A high voltage power supply 34 is connected to liquid metal ion source 14 as well as to appropriate electrodes in focusing column 16 for forming an approximately 25 keV ion beam 18 and directing the same downwardly. Deflection controller and amplifier 36, which can be operated in accordance with a prescribed pattern such as a raster pattern provided by pattern generator 38, is suitably coupled to deflection plates 20 whereby beam 18 can be controlled to trace out a given pattern such as a raster pattern on the surface of sample 22.

The source 14 typically provides a beam of gallium ions although other ions could be used such as inert gas ions or other metallic ions, for example indium, aluminum, or silicon. The source is capable of being focused into a sub 0.1 micron width beam at sample 22. An electron multiplier 40 can be used for secondary emission imaging and is connected to video circuit and amplifier 42, the latter supplying drive for video monitor 44 also receiving deflection signals from controller 36.

The focused ion beam system is further provided with a source 46 for supplying iodine vapor. The source is located inwardly of the side of chamber 26 by translation device 48 adapted for positioning the source via support means within bellows 52. The source 46 in particular comprises a reservoir or crucible 50. A heater 54, which may comprise a membrane type heater, is utilized for raising the temperature of iodine crystals located within reservoir or crucible 50 to a temperature for providing a suitable vapor pressure, i.e., a temperature between approximately 30° C. and 50° C. A transfer tube or nozzle 56 extends from reservoir 50 and is connected thereto via control valve 58 adapted for releasing iodine vapor. The nozzle is extended and translated in orthogonal directions substantially perpendicular to its axis employing translation apparatus 48, so that iodine vapor can be aimed directly toward a region on the top surface of sample 22 wherein material is to be removed or analyzed in conjunction with operation of ion beam 18.

A door 60 is opened for inserting sample 22 on stage 24, and also for inserting iodine crystals within reservoir or crucible 50. The door is interlocked so that it cannot be opened if the temperature in reservoir 50 is substantially above room temperature. A gate valve, schematically illustrated at 62, is closed before door 60 can be opened to seal off the ion source and focusing column apparatus. The base pressure within chamber 26 is $1 \times 10^{-6}$ Torr. With the emission of the iodine from the vapor source 46, the chamber background pressure is $1 \times 10^{-5}$ Torr.

Figure 2:
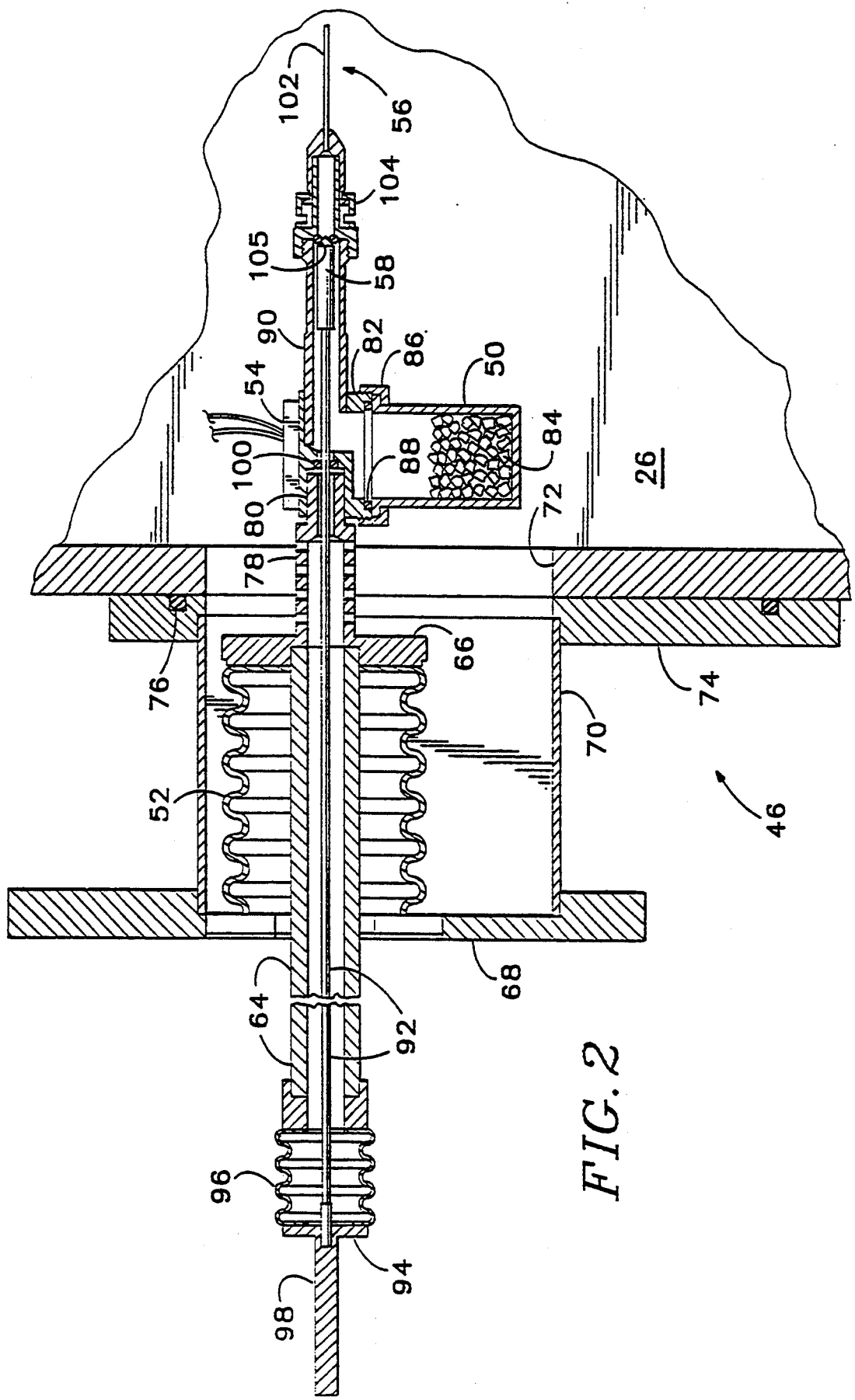
FIG. 2 is a partially broken away, cross sectional view illustrating in greater detail a vapor source for the system of FIG. 1.

Vapor source 46, illustrated schematically in FIG. 1, is depicted in greater detail in FIG. 2. A valve shaft tube 64 is supported by a translation apparatus or manipulator (not shown in FIG. 2) and extends inwardly toward sample chamber 26 through bellows 52 where it joins bellows header 66. The bellows 52 is disposed generally coaxially about tube 64 between header 66 and apertured end plate 68 through which tube 64 also passes. End plate 68 is located outwardly from the wall of chamber 26 forming the cover of cylindrical chamber extension 70 aligned with and positioned over an aperture 72 in the sidewall of chamber 26. The cylindrical chamber extension 70 is joined to a radial flange 74 that is secured to the wall of chamber 26 by means not shown. An O-ring seal 76 is fitted within a circular groove in flange 74 to bear against the sidewall of the sample chamber.

Valve shaft tube 64 communicates with a header tubular housing portion 78 which is aligned with tube 64 and ends in a necked down portion or nozzle 80 received within an upper horizontal passage in container cap 82. Tubular housing portion 78 is provided with a plurality of apertures so that the vacuum within chamber 26 is also maintained within tube 64.

Crucible 50 receives solid iodine as indicated at 84 and has an upper radial flange captured within an annular retainer 86 internally threaded and securable onto cap 82. An O-ring 88 is interposed between the radial flange of crucible 50 and the lower threaded portion of the cap 82. Secured to the top of cap 82 is an electrical heater element 54 provided control current for the purpose of maintaining crucible 50 at a predetermined temperature.

Cap 82 is further supplied with a delivery tube 90 communicating with the interior of the cap and the crucible, and which slideably receives therewithin tapered end valve member 58. Valve member 58 is carried at one end of valve shaft 92 that passes through valve shaft tube 64, tubular housing portion 78, the upper part of cap 82, and the delivery tube 90. Valve member 58 is adapted to be extended and withdrawn by means of longitudinal movement of valve shaft 92, the latter being secured to header 94 of bellows 96 attached to the end of tube 64 farthest from the chamber 26. A handle 98 extending from header 94 can be manipulated in a longitudinal direction either manually or by mechanical means not shown for operating the valve. The shaft 92 also passes through an O-ring seal 100 in a vertical wall at the top of cap 82 where the shaft 92 then extends into the vapor atmosphere from crucible 50.

Nozzle 56 suitably takes the form of a hypodermic needle 102 received in a bayonet joint at the inner end of a tubular fitting 104 threadably received over the end of delivery tube 58. An O-ring seal or valve seat 105 is located at the juncture between delivery tube 90 and fitting 104 such that the tapered end of valve member 58 is positionable thereagainst for closing the valve and preventing delivery of the vapor to the interior of chamber 26.

In order to place the iodine crystals 84 within crucible 50, door 60 (in FIG. 1) is opened and annular retainer 86 is threadably disengaged from cap 82 whereby the crucible 50 can be removed downwardly. Iodine crystals 84 can then be placed in crucible 50 after which the crucible is again positioned below cap 82 and retainer 86 is employed to secure the crucible in the position shown. Door 60 can be opened and material can be inserted in crucible 50 only when the temperature thereof (measured by means not shown) is approximately room temperature, e.g. 29° C. or less. Also, door 60 can be operated only when chamber 26 is returned to ambient pressure, with gate valve 62 in place to seal off the upper part of the apparatus. After placement of material in crucible 50 (and presumably after placement of sample 22 on stage 24), the chamber is suitably evacuated employing pumping means 28 and 30 under the control of means 32. The valve 58 is maintained in an open position during initial chamber evacuation in order to evacuate the crucible, but is returned to a closed position when a predetermined vacuum level is reached. Then, heater 54 may be operated to raise the temperature of the iodine crystals whereby iodine vapor is generated for direction toward the sample 22 by means of nozzle 56. When crucible 50 is raised to a desired temperature between 30° and 50° C., valve 58 may be opened as the nozzle 56 is directed towards the desired area of the sample. Bellows 52 accommodates movement of the entire nozzle assembly and crucible relative to the sample, while bellows 96 permits extension and retraction of valve 58 without affecting the vacuum within chamber 26.

Summarizing, sample 22 is placed on stage 24 while solid iodine is deposited in crucible 50, after which the chamber 26 is closed and evacuated and gate 62 is opened so that an ion beam 18 can be generated and directed toward the sample. The sample can be positioned by movement of stage 24 in a well understood manner. Nozzle 56 is positioned so that iodine vapor can be directed towards the area of interest as crucible 50 is heated by element 54 to an approximate range between 30° C. and 50° C. and valve 58 is opened to permit escape of the iodine vapor. Pattern generator 38 can be programmed to deflect ion beam 18 in a raster pattern corresponding to a specific area of sample 22 in a well understood manner on monitor 44.

As the iodine vapor is directed toward the surface of a sample (e.g. sample 22 in FIG. 1), iodine is adsorbed on such surface for enabling chemical reaction to take place between iodine and the material of said surface. As the focused ion beam scans a surface of a sample, a reaction product is removed or sputtered away. Rapid and accurate machining of surfaces including metal conductors in integrated circuit devices can be selectively carried out as desired.

Figure 3:
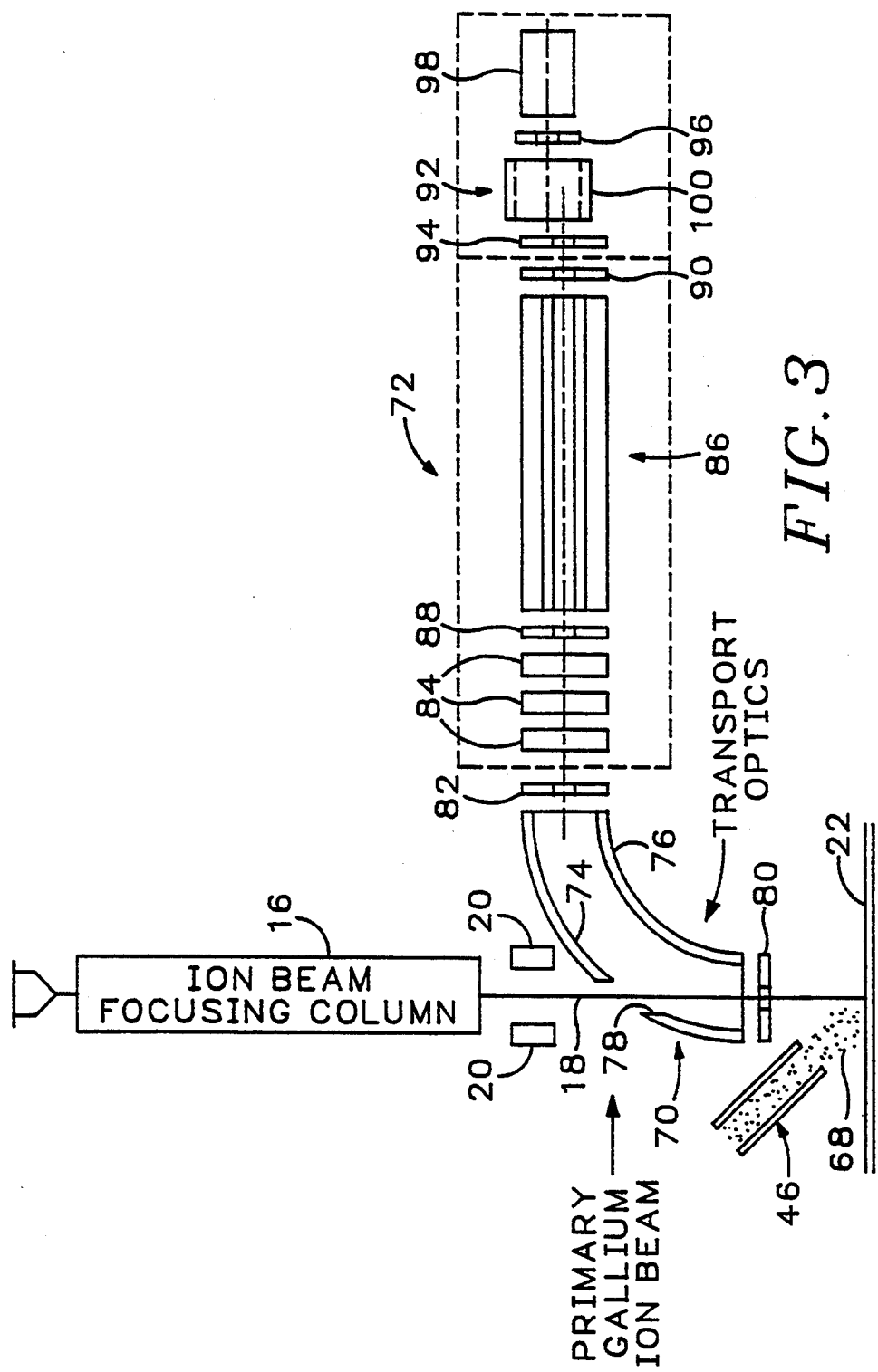
FIG. 3 is a schematic representation of a system according to the present invention provided with mass analysis means.

In addition to its milling function, the system according to the present invention is advantageously employed to carry out secondary ion mass spectrometry or SIMS whereby the sample bombarded by focused primary ion beam 18 is analyzed chemically. Referring to FIG. 3, illustrating in schematic form analysis apparatus according to the present invention, transport optics 70 and mass spectrometer 72 are positioned with respect to the ion beam column for collecting secondary ions produced at sample 22 by virtue of impingement of the primary ion beam 18. The viewing direction in FIG. 3 is substantially orthogonal to the viewing direction of FIG. 1, i.e., transport optics 70 and mass spectrometer 72 suitably extend rearwardly within an extension of chamber 26 depicted in FIG. 1. The transport optics include concentrically curved collection members 74 and 76 between which secondary ions are received by way of aperture 80 for direction toward mass spectrometer 72. Primary beam 18 passes downwardly through an aperture 78 in upper collection member 74 as well as through aperture plate 80 before striking sample 22. As will be understood by those skilled in the art, a voltage differential is applied between members 74 and 76 for selecting secondary ions to be steered through aperture 82 so they are within a desired energy band. Aperture plates 80 and 82 compensate for fringe electrostatic fields.

The collected secondary ions directed to means 72 are received by lens configuration 84 comprising a plurality of cylindrical sections which are coaxial with the stream of secondary ions. Appropriate voltages are applied to the elements of lens means 84 for focusing as well as for slowing down the ion stream so that it can be analyzed. The focused ion stream then passes to quadrupole 86 via aperture 88, while a second aperture 90 is positioned at the quadrupole exit, the plates providing apertures 88 and 90 being connected to appropriate voltages to reduce fringe field effects between ends of the quadrupole rods.

Ion detector section 92 converts the ions into signals appropriate for coupling to an electronic system including a computer for calculating and collecting analysis results. Entrance aperture 94 and a second aperture 96 are offset from each other to prevent unwanted high energy particles from entering ion sensor 98. To permit this offset, a cylindrical lens 100 is interposed between the apertures 94 and 96. The ion sensor 98 suitably comprises an electron multiplier receiving ions accelerated by a voltage difference between apertures 90 and 94, and electrons consequently produced in the electron multiplier provide an appropriate output signal. The detailed operation of the quadrupole mass spectrometer and ion detector is well understood by those skilled in the art.

In accordance with the present invention the quantity of secondary ions produced for analysis is greatly increased by virtue of the introduction of iodine vapor from source 46, thereby enhancing the sensitivity and accuracy of analysis. It is postulated that the dramatically increased production of ions is a result of increased overall sputtering rate and an enhanced conversion of neutral to ionic sputtered species.

No plumbing of an external gas is required, and the same system can be used for analysis as well as for machining a sample. Machining can be advantageously employed in conjunction with analysis when the chemistry of a particular layer is to be investigated, since the ion beam can be first used to machine down to the desired layer.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A secondary ion mass spectrometry process comprising the steps of:
    positioning a sample to be analyzed within an enclosed chamber,
    supplying iodine vapor within said chamber,
    generating an ion beam,
    directing said ion beam toward said surface for sputtering secondary ions from at least a portion of said surface,
    receiving secondary ions from said surface of said sample, and
    directing said secondary ions to mass analyzer means.

2. The process according to claim 1 wherein said iodine vapor is provided within said chamber by heating solid iodine within said chamber.

3. The process according to claim 1 wherein said ion beam is generated employing a liquid metal ion source.

4. The process according to claim 3 wherein said metal comprises gallium.

5. The process according to claim 1 including substantially evacuating said chamber for maintaining the interior of the chamber at a low pressure.

6. The process according to claim 1 including directing said iodine vapor toward the surface of said sample.

7. The process according to claim 1 including deflecting said ion beam according to a pattern of movement.

8. The process of analyzing a sample comprising the steps of:
    positioning said sample on a stage within a substantially gas tight chamber of a focused ion beam system,
    positioning solid iodine within said chamber and heating said iodine to a temperature in excess of 30° C. for generating iodine vapor,
    directing said iodine vapor towards a region of said sample where analysis is desired, for enabling reaction between iodine and material from which said sample is formed,
    generating a focused ion beam by means of said focused ion beam system and directing said ion beam toward said region of said sample for generating secondary ions, and
    analyzing said secondary ions to determine the chemical makeup of said region of said sample.

9. The process according to claim 8 including, prior to said analyzing step, the step of machining said sample by sputtering with said ion beam for removing material above a level where analysis is desired.

10. A method of increasing the secondary ion yield of sample materials bombarded by an ion beam, said method comprising the steps of:
    directing an ion beam toward a location on a sample material, and
    directing iodine vapor at said location while said ion beam is incident thereon for enhancing secondary ion yield.

11. The method according to claim 10 wherein the ion beam is a focused ion beam from a liquid metal ion source.

12. A method of analyzing secondary ions of sample materials bombarded by an ion beam, said method comprising the steps of:
- directing an ion beam toward a location on a sample material,
- directing iodine vapor at said location while said ion beam is incident thereon for enhancing secondary ion yield, and
- analyzing secondary ions produced according to mass.

13. The method according to claim 12 including milling said sample material with said ion beam prior to said mass analysis for the purpose of exposing material to be analyzed at a desired depth of said sample.

14. The method according to claim 12 wherein the ion beam is a focused ion beam from a liquid metal ion source.

15. Apparatus for performing secondary ion mass spectrometry with respect to a sample, said apparatus comprising:
- means for directing an ion beam at said sample,
- means for directing iodine vapor toward said sample,
- mass analyzer means, and
- means for collecting secondary ions from said sample and directing said ions toward said analyzer means.

16. The apparatus according to claim 15 wherein said mass analyzer means comprises a quadrupole mass analyzer.

* * * * *